(12) United States Patent
Bosch

(10) Patent No.: US 7,802,539 B2
(45) Date of Patent: Sep. 28, 2010

(54) SEMICONDUCTOR PROCESSING EQUIPMENT HAVING IMPROVED PARTICLE PERFORMANCE

(75) Inventor: William Frederick Bosch, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1150 days.

(21) Appl. No.: 11/103,446

(22) Filed: Apr. 12, 2005

(65) Prior Publication Data

US 2005/0181617 A1 Aug. 18, 2005

Related U.S. Application Data

(63) Continuation of application No. 09/607,922, filed on Jun. 30, 2000, now Pat. No. 6,890,861.

(51) Int. Cl.
| | |
|---|---|
| *C23C 16/50* | (2006.01) |
| *C23C 16/503* | (2006.01) |
| *C23C 16/505* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl. ............... 118/723 E; 156/345.33; 156/345.34; 156/345.43; 118/723 R

(58) Field of Classification Search ........... 118/715, 118/728, 50, 723 E, 723 R; 427/189–193, 427/202–203; 156/345.33, 345.34, 345.43

See application file for complete search history.

(56) References Cited

U.S. PATENT DOCUMENTS 3,951,587 A 4/1976 Alliegro et al.

(Continued)

FOREIGN PATENT DOCUMENTS

EP 0865070 A1 9/1998

(Continued)

OTHER PUBLICATIONS

Man F. Yan, "Solid-State Sintering" in Engineering Materials Handbook, v. 4, 1994, ASM International, pp. 270-284.*

(Continued)

*Primary Examiner*—Rudy Zervigon
(74) *Attorney, Agent, or Firm*—Buchanan Ingersoll & Rooney PC

(57) ABSTRACT

A ceramic part having a surface exposed to the interior space, the surface having been shaped and plasma conditioned to reduce particles thereon by contacting the shaped surface with a high intensity plasma. The ceramic part can be made by sintering or machining a chemically deposited material. During processing of semiconductor substrates, particle contamination can be minimized by the ceramic part as a result of the plasma conditioning treatment. The ceramic part can be made of various materials such as alumina, silicon dioxide, quartz, carbon, silicon, silicon carbide, silicon nitride, boron nitride, boron carbide, aluminum nitride or titanium carbide. The ceramic part can be various parts of a vacuum processing chamber such as a liner within a sidewall of the processing chamber, a gas distribution plate supplying the process gas to the processing chamber, a baffle plate of a showerhead assembly, a wafer passage insert, a focus ring surrounding the substrate, an edge ring surrounding an electrode, a plasma screen and/or a window.

24 Claims, 10 Drawing Sheets

U.S. PATENT DOCUMENTS

| | | | |
|---|---|---|---|
| 4,340,462 A | | 7/1982 | Koch |
| 4,401,689 A | | 8/1983 | Ban |
| 4,518,349 A | | 5/1985 | Tressler et al. |
| 4,598,665 A | | 7/1986 | Tanaka et al. |
| 4,761,134 A | | 8/1988 | Foster |
| 4,883,703 A | * | 11/1989 | Riccio et al. .............. 428/142 |
| 4,948,458 A | | 8/1990 | Ogle |
| 4,999,228 A | | 3/1991 | Matsumoto et al. |
| 5,006,220 A | | 4/1991 | Hijikata et al. |
| 5,022,979 A | | 6/1991 | Hijikata et al. |
| 5,051,134 A | | 9/1991 | Schnegg et al. |
| 5,074,456 A | | 12/1991 | Degner et al. |
| 5,182,059 A | | 1/1993 | Kawasaki et al. |
| 5,200,232 A | * | 4/1993 | Tappan et al. .............. 427/569 |
| 5,236,875 A | * | 8/1993 | Trigg et al. .................... 501/89 |
| 5,252,892 A | | 10/1993 | Koshiishi et al. |
| 5,262,029 A | | 11/1993 | Erskine et al. |
| 5,292,399 A | | 3/1994 | Lee et al. |
| 5,296,288 A | * | 3/1994 | Kourtides et al. ........... 442/178 |
| 5,391,275 A | | 2/1995 | Mintz |
| 5,431,964 A | | 7/1995 | Rivoire |
| 5,454,901 A | | 10/1995 | Tsuji |
| 5,460,684 A | | 10/1995 | Saeki et al. |
| 5,482,673 A | * | 1/1996 | Alexander et al. ............ 419/48 |
| 5,494,524 A | | 2/1996 | Inaba et al. |
| 5,538,230 A | | 7/1996 | Sibley |
| 5,569,356 A | | 10/1996 | Lenz et al. |
| 5,578,129 A | | 11/1996 | Moriya |
| 5,595,627 A | | 1/1997 | Inazawa et al. |
| 5,665,168 A | | 9/1997 | Nakano et al. |
| 5,712,198 A | | 1/1998 | Shive et al. |
| 5,744,401 A | | 4/1998 | Shirai et al. |
| 5,766,684 A | | 6/1998 | Shah et al. |
| 5,800,618 A | * | 9/1998 | Niori et al. ............... 118/723 E |
| 5,820,723 A | | 10/1998 | Benjamin et al. |
| 5,837,662 A | | 11/1998 | Chai et al. |
| 5,838,529 A | | 11/1998 | Shufflebotham et al. |
| 5,863,376 A | | 1/1999 | Wicker et al. |
| 5,888,907 A | | 3/1999 | Tomoyasu et al. |
| 5,892,236 A | | 4/1999 | Takahashi et al. |
| 5,904,778 A | * | 5/1999 | Lu et al. .................. 118/723 R |
| 5,937,316 A | | 8/1999 | Inaba et al. |
| 6,054,373 A | | 4/2000 | Tomita et al. |
| 6,120,640 A | * | 9/2000 | Shih et al. ................. 156/345.1 |
| 6,159,297 A | | 12/2000 | Herchen et al. |
| 6,267,121 B1 | | 7/2001 | Huang et al. |
| 6,268,014 B1 | * | 7/2001 | Eberspacher et al. ........... 427/74 |
| 6,506,254 B1 | * | 1/2003 | Bosch et al. ................. 118/715 |
| 6,630,100 B1 | * | 10/2003 | Murakami et al. ............. 419/12 |
| 6,706,319 B2 | * | 3/2004 | Seth et al. .................... 427/190 |
| 6,726,741 B2 | * | 4/2004 | Murakami et al. ............. 75/252 |
| 6,808,747 B1 | * | 10/2004 | Shih et al. .................. 427/249.5 |
| 6,814,813 B2 | * | 11/2004 | Dando et al. ................. 118/719 |

FOREIGN PATENT DOCUMENTS

| | | |
|---|---|---|
| EP | 0892083 | 1/1999 |
| JP | 54-10825 | 1/1979 |
| JP | 60-200519 | 10/1985 |
| JP | 61-284301 | 12/1986 |
| JP | 63-35452 | 2/1988 |
| JP | 63-138737 | 6/1988 |
| JP | 63-186874 | 8/1988 |
| JP | 3-201322 | 9/1991 |
| JP | 8-17745 | 1/1996 |
| WO | WO 99/20812 A1 | 4/1999 |
| WO | WO 99/50886 A1 | 10/1999 |

OTHER PUBLICATIONS

Randall M. German, "Fundamentals of Sintering" in Engineering Materials Handbook, v. 4, 1994, ASM International, pp. 260-269.*

PCT Search Report dated Feb. 19, 2002 for International Application No. PCT/US01/20284.

Written Opinion dated Aug. 19, 2002 for International Application No. PCT/US01/20284.

* cited by examiner

SEMICONDUCTOR PROCESSING EQUIPMENT HAVING IMPROVED PARTICLE PERFORMANCE

This application is a continuation application of application Ser. No. 09/607,922, filed Jun. 30, 2000 now U.S. Pat. No. 6,890,861, entitled SEMICONDUCTOR PROCESSING EQUIPMENT HAVING IMPROVED PARTICLE PERFORMANCE, which is incorporated herein by reference.

FIELD OF THE INVENTION

The invention relates to semiconductor processing equipment and more particularly to improved particle performance during processing of semiconductor substrates in vacuum chambers having shaped ceramic parts therein.

BACKGROUND OF THE INVENTION

Particle performance is of concern in processing semiconductor substrates such as silicon wafers due to reduction in yield caused by particles adhered to the surface of such substrates. One source of such particles is the substrates and techniques for reducing the number of particles include chemical treatments. For instance, U.S. Pat. No. 5,051,134 discloses a wet chemical treatment for reducing the number of particles by treating a semiconductor surface with an aqueous solution containing hydrofluoric acid. The '134 patent states that the acid solution includes commercially available hydrofluoric acid and water which meet the exceptionally high purity and particle freedom requirements of the semiconductor industry.

U.S. Pat. No. 5,665,168 discloses a method for cleaning a silicon wafer so as to suppress and reduce adhesion of particles to the surface of the wafer wherein the wafer is cleaned with a hydrofluoric acid aqueous solution containing a surfactant followed by rinsing the wafer with pure water containing ozone. U.S. Pat. No. 5,837,662 discloses a process for cleaning contaminants from the surface of a wafer after the wafer has been lapped, the process including contacting the wafer with an oxidizing agent to oxidize organic contaminants and immersing the wafer in an aqueous bath containing citric acid into which sonic energy is directed to remove metallic contaminants present on the surface of the wafer. The '662 patent states that the citric acid is a complexing agent which serves to trap metal ions and that particles of lapping grit and trace metallic impurities present in a layer of silicon oxide (which is part native oxide and partly formed in the oxidizing bath) can be removed along with the oxide layer by contacting the wafer with hydrofluoric acid.

U.S. Pat. No. 5,712,198 discloses a technique for treating silicon wafers to reduce the concentration of metals such as Cr, Ca, Ti, Co, Mn, Zn and V on the surface thereof, the process including precleaning with a cleaning solution, metals removal with an aqueous solution containing HF, rinsing and oxide growth to produce a silicon oxide layer with a thickness of 0.6 to 1.5 nanometers by contacting the wafers with high purity ozonated water having a concentration of no more than 0.01 parts per billion each of Fe, Cr, Ti and other metals. Other patents which relate to cleaning of semiconductor substrates include U.S. Pat. Nos. 5,454,901; 5,744,401; and 6,054,373.

U.S. Pat. No. 5,766,684 discloses a technique for cleaning and passivating stainless steel surfaces such as gas flow equipment which can be used in semiconductor processing equipment, the process including contacting the surfaces with an aqueous solution containing acid so as to dislodge and remove residue followed by complexing free Fe ions liberated from the surface to form an oxide film and precipitating the complexed ions into the oxide film.

U.S. Pat. No. 4,761,134 discloses silicon carbide components (e.g., liners, process tubes, paddles, boats, etc.) for semiconductor diffusion furnaces used to process silicon wafers wherein high purity silicon carbide components are impregnated with high purity silicon metal and coated with a high purity dense, impervious refractory coating such as silicon carbide, silicon nitride or silicon dioxide. According to the '134 patent, the silicon carbide must be at least 99% pure (preferably at least 99.9% pure) so as not to be a source of contamination to the furnace environment during sensitive wafer processing steps and the refractory coating protects the silicon impregnated sintered silicon carbide substrate from exposure to the furnace environment and attack by acid during acid cleaning. Other patents relating to silicon carbide semiconductor processing components include U.S. Pat. No. 4,401,689 (susceptor tube), U.S. Pat. No. 4,518,349 (furnace support rod), U.S. Pat. No. 4,999,228 (diffusion tube), U.S. Pat. No. 5,074,456 (upper electrode), U.S. Pat. No. 5,252,892 (plasma cathode chamber), U.S. Pat. No. 5,460,684 (resistive layer of ESC), U.S. Pat. No. 5,463,524 (sensing pin), U.S. Pat. No. 5,494,524 (heat treatment device), U.S. Pat. No. 5,578,129 (filter plate of load lock system), U.S. Pat. No. 5,538,230 (wafer boat), U.S. Pat. No. 5,595,627 (upper electrode), U.S. Pat. No. 5,888,907 (electrode plate), U.S. Pat. No. 5,892,236 (ion implantation device) and U.S. Pat. No. 5,937,316 (heat treatment device such as susceptor, wafer holder, thermal uniformity plate, thermal uniformity ring, dummy wafer). See also, Japanese Patent Publication Nos. 54-10825 (semiconductor diffusion oven material), 60-200519 (susceptor), 61-284301 (upper electrode), 63-35452 (diffusion oven tube, liner tube, port element, paddle), 63-186874 (microwave heated sample plate), 63-138737 (upper electrode of plasma etch reactor), 3-201322 (coating for part in vacuum environment), and 8-17745 (wafer heater). Of these, Japanese Patent Publication Nos. 54-10825 and 63-35452 disclose parts made of slip cast silicon carbide.

U.S. Pat. No. 4,598,665 discloses a technique for reducing dust during heat treatment of semiconductor wafers by providing a silicon carbide process tube (wherein the wafers are treated) with an inner surface coarseness of 150 μm or less. The '665 patent states that when the surface coarseness is greater than 150 μm, a porous $SiO_2$ film is formed on the inner surface of the process tube leading to dust generation.

U.S. Pat. No. 5,904,778 discloses a SiC CVD coating on free standing SiC for use as a chamber wall, chamber roof, or collar around the wafer. U.S. Pat. No. 5,292,399 discloses a SiC ring surrounding a wafer pedestal. A technique for preparing sintered SiC is disclosed in U.S. Pat. No. 5,182,059.

With regard to plasma reactor components such as showerhead gas distribution systems, various proposals have been made with respect to the materials of the showerheads. For instance, U.S. Pat. No. 5,569,356 discloses a showerhead of silicon, graphite, or silicon carbide. U.S. Pat. No. 5,888,907 discloses a showerhead electrode of amorphous carbon, SiC or Al. U.S. Pat. Nos. 5,006,220 and 5,022,979 disclose a showerhead electrode either made entirely of SiC or a base of carbon coated with SiC deposited by CVD to provide a surface layer of highly pure SiC.

In view of the need for increased yield during semiconductor processing, there is a need in the art for improvements in reduction of particles caused by shaped (e.g., machined and/or sintered) ceramic parts exposed to the gases and/or the environment in which the semiconductor substrates are processed.

SUMMARY OF THE INVENTION

The invention provides a method of processing semiconductor substrates and reducing particle contamination during processing of the substrates, the method comprising steps of placing a substrate on a substrate holder in an interior space of a vacuum processing chamber, the processing chamber including at least one non-oxide ceramic part having a surface exposed to the interior space, the surface having been shaped and treated to reduce particles thereon by a high intensity plasma conditioning treatment, processing the substrate by supplying process gas to the processing chamber; and removing the substrate from the processing chamber.

According to a preferred embodiment, the processing chamber includes a substantially planar antenna which energizes the process gas into a plasma state by supplying RF power to the antenna and the process gas comprises at least one fluorocarbon gas, the method further including conditioning the exposed surface by energizing the fluorocarbon gas into a plasma state and contacting the exposed surface with the plasma. During the process, a plurality of substrates can be processed by etching an oxide layer on the substrates with a high density plasma while supplying an RF bias to the substrate.

In an exemplary embodiment, the ceramic part comprises a gas distribution plate supplying the process gas to the processing chamber and the processing chamber includes a substantially planar coil which energizes the process gas into a plasma state by supplying RF power to the antenna, the method further including conditioning the exposed surface by adjusting pressure in the processing chamber to 200 to 500 mTorr, supplying the coil with 2000 to 2500 W of radio frequency power, and/or changing coil termination capacitance of the coil so as to move an area of higher intensity plasma across the gas distribution plate.

The method can further comprise a step of manufacturing the ceramic part by machining a part made of carbon, silicon, silicon carbide, silicon nitride, boron nitride, boron carbide, aluminum nitride or titanium carbide. In the case of a silicon carbide part, the part can be made of CVD SiC, sintered SiC, sintered SiC coated with CVD SiC, converted graphite, or porous SiC backfilled with Si.

The invention also provides a method of plasma conditioning a shaped surface of a ceramic part of a semiconductor processing chamber, the method comprising treating the shaped surface to reduce particles thereon by contacting the shaped surface with a high intensity plasma. For example, the method can include installing the ceramic part in a plasma reactor and the plasma conditioning can be carried out by treating the shaped surface with a high density plasma while powering the ceramic part to increase ion bombardment thereof, treating the shaped surface with a high density plasma generated by energizing a halogen gas into a plasma state, treating the shaped surface with a high density plasma generated by energizing an inert gas into a plasma state, treating the shaped surface with a high density plasma generated by energizing oxygen gas into a plasma state, treating the shaped surface with a high density plasma generated by energizing a fluorine containing gas into a plasma state, and/or treating the shaped surface with a high density plasma while seasoning the reactor.

DETAILED DESCRIPTION OF THE PREFERRED EMBODIMENTS

Figure 1A:
FIGS. 1a-d show SEM images of a machined CVD SiC sample which has been subjected to a $CO_2$ cleaning process.
Figure 1B:
Figure 1C:
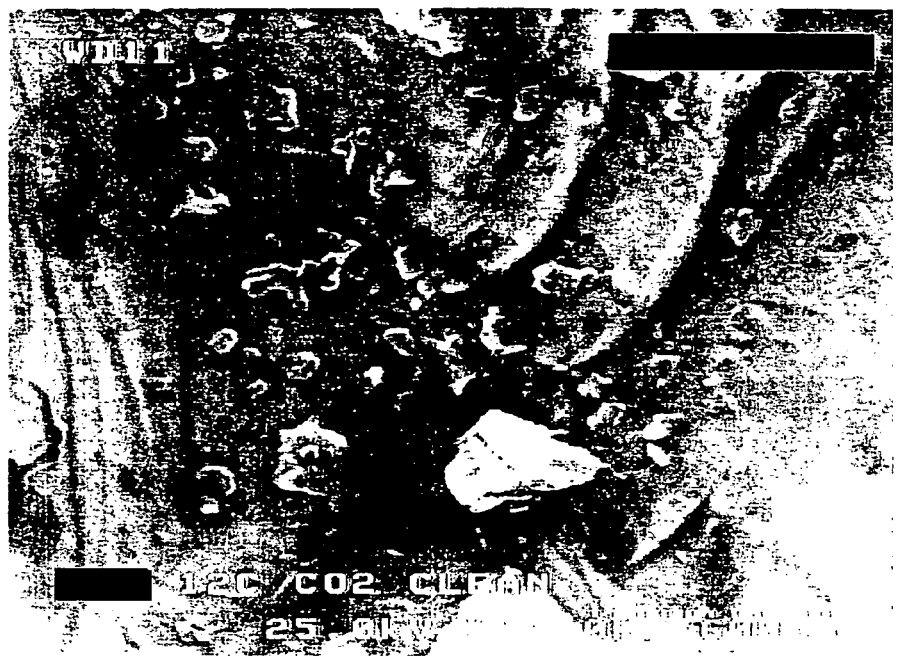
Figure 1D:
Figure 2A:
FIGS. 2a-d show SEM images of a machined CVD SiC sample which has been subjected to a low pressure SiC bead blasting process followed by $CO_2$ cleaning.
Figure 2B:
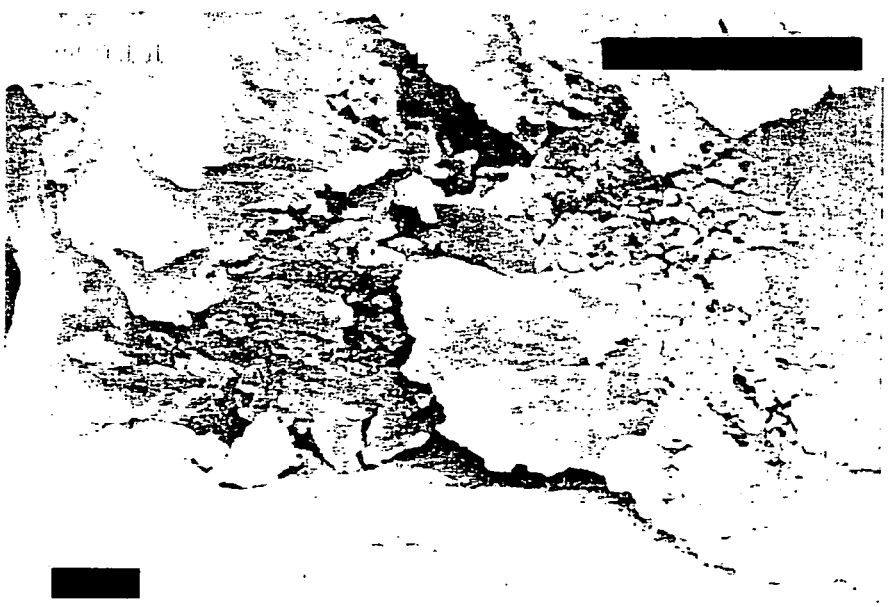
Figure 2C:
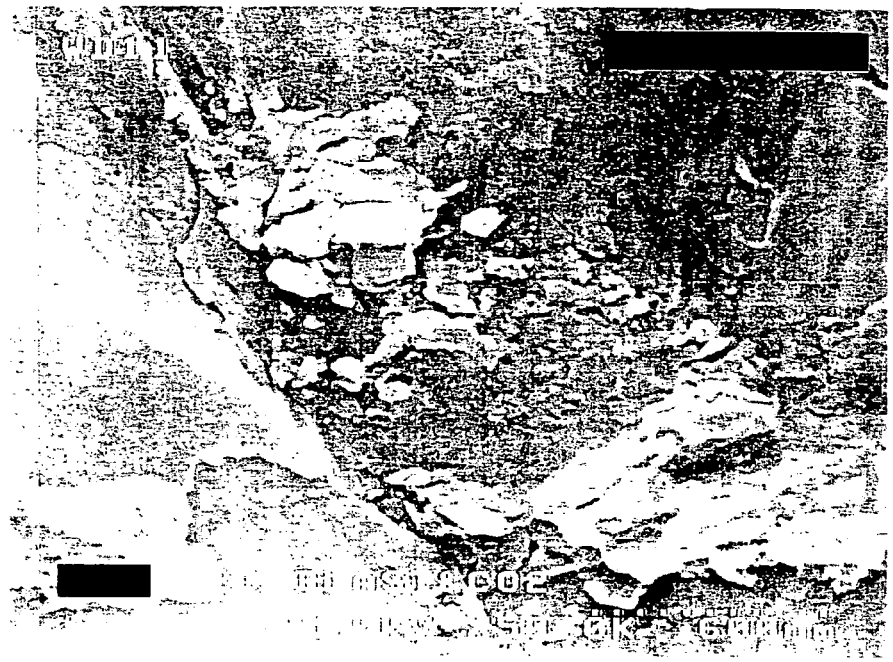
Figure 2D:

In the field of semiconductor processing, various shaped parts of vacuum chambers in which semiconductor substrates are processed can be the source of particle generation which adversely affects the yield of devices produced on the substrates. According to the invention, such shaped parts are treated to minimize particle contamination of the semiconductor substrates processed in the chamber.

Ceramic materials such as silicon carbide, silicon nitride, and the like have been used for parts of equipment used in vacuum chambers. Such parts can be made by sintering ceramic powders or by a CVD process followed by machining of one or more surfaces thereof. The shaped surfaces can be the source of particle contamination during processing of semiconductor substrates. According to the invention, in order to condition such parts to minimize particle generation during semiconductor processing, the exposed surfaces of such parts are treated to incorporate or remove particles from the exposed surface. According to a preferred embodiment, the surface layer is oxidized and the oxide layer is optionally removed in a manner which reduces the number of attached particles.

In the field of semiconductor processing, vacuum processing chambers are generally used for rapid thermal processing, sputtering, ion implantation or ion milling, etching and chemical vapor deposition (CVD) of materials on substrates by supplying a process gas to the vacuum chamber. Such chambers may or may not apply an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in U.S. Pat. Nos. 4,340,462; 4,948,458; 5,200,232 and 5,820,723. Because of the requirements for minimizing particle and/or heavy metal contamination, it is highly desirable for the components of such equipment to exhibit high corrosion resistance with minimum particle generation.

During processing of semiconductor substrates, the substrates are typically held in place within the vacuum chamber on substrate holders by parts such as mechanical clamps and electrostatic clamps (ESC). Examples of such clamping systems and components thereof can be found in U.S. Pat. Nos. 5,262,029 and 5,838,529. Process gas can be supplied to the chamber by parts such as by gas nozzles, gas rings, gas distribution plates, etc. An example of a temperature controlled gas distribution plate for an inductively coupled plasma reactor and components thereof can be found in U.S. Pat. No. 5,863,376.

According to the invention, vacuum chamber parts made of oxide or non-oxide ceramic materials such as alumina, silicon dioxide, quartz, carbon, silicon, silicon carbide, silicon nitride, boron nitride, boron carbide, aluminum nitride and titanium carbide are treated to minimize particle generation. In a preferred embodiment, shaped (sintered and/or machined) surfaces of the parts are subjected to a plasma conditioning treatment to improve the particle performance of the parts. The plasma conditioning treatment can be combined with an optional oxidizing treatment to form an oxide layer on the parts and an optional cleaning treatment to remove the oxide layer. The oxidizing treatment can comprise a heat treatment in a furnace and the cleaning treatment can comprise an etching treatment with an aqueous acid solution.

According to a preferred embodiment of the invention, an oxide or non-oxide ceramic part of a plasma reactor is subjected to a plasma conditioning treatment subsequent to an optional oxidizing treatment and/or chemical etching to remove an oxide layer formed during the oxidizing step. As a result, attached particles which result from machining can be removed from the part prior to or subsequent to installation in the plasma reactor. It has been found that after such treatment it is possible to achieve production conditions for processing semiconductor wafers much faster than in the case where the part is only subjected to chemical cleaning prior to installation in the reactor. In the case where an oxidizing treatment is also performed, because the particles would be incorporated in the oxide layer, the part could be used without removing the oxide layer.

According to a first embodiment of the invention, the oxide or non-oxide ceramic part has been shaped by machining to desired dimensions and/or to provide a surface feature thereon such as a groove to receive an O-ring seal, bolt holes, gas distribution holes or passages, boss, flange, or the like. The machining can be performed by any suitable technique such as grinding, lapping, honing, ultrasonic machining, water jet or abrasive jet machining, laser machining, electrical discharge machining, ion-beam machining, electron-beam machining, chemical machining, electrochemical machining, or the like. Such abrasive and non-abrasive machining methods can result in attached particles on the machined surfaces of the ceramic parts and the attached particles can become sources of particle contamination during processing of semiconductor substrates. Likewise, the shaped surfaces of sintered ceramic parts can be the source of particle contamination.

One type of non-oxide ceramic material which can be used for parts in accordance with the invention is silicon carbide (SiC). The SiC part can be manufactured by any suitable technique. For instance, the part can be made by chemical vapor deposition of silicon carbide on a suitable substrate such as high purity graphite followed by machining to final dimensions. If the as-machined part is installed in a wafer processing plasma reactor such as a plasma etch chamber, initially processed wafers can be contaminated with thousands of particles (e.g., around 20,000 particles called "adders").

According to one embodiment of the invention, a non-oxide ceramic part made of silicon carbide is treated to improve particle performance by subjecting the part to a heat treatment in an air environment which provides a surface oxide layer on the part. The oxidizing treatment is effective to encapsulate the particles in the oxide layer and/or convert the particles to an oxide which forms part of the oxide layer. The oxide layer can then be optionally removed by a chemical etching treatment. For example, the part can be heated in a furnace at 1200 to 1700° C. for 1 to 100 hours, preferably 1400 to 1500° C. for 8 to 16 hours, to form an oxide layer which is subsequently removed in an acid bath. After such a treatment, the part can be installed in a plasma reactor such as a plasma etcher and wafers can be processed after routine chamber seasoning. However, parts which are subjected to intense ion bombardment like a gas distribution or baffle plate may benefit from an aggressive plasma conditioning step. For example, the part can be powered to increase ion bombardment of the machined surface, a halogen gas such as a fluorine-containing gas and/or oxygen and/or an inert gas such as argon can be incorporated in the plasma to more aggressively attack/sputter the machined surface, plasma conditions in the chamber can be adjusted such as by varying the terminal capacitance of the TCP™ coil to move a zone of higher density plasma across the machined surface, and/or other process parameters (e.g., increase chamber pressure, increase RF power, increase gas concentration and/or reactive components of the gas, increase treatment time, provide a magnetic field to confine plasma to a smaller area, use of various high density plasma sources such as helicon or microwave sources, etc.) can be modified to further condition the shaped surface.

In tests of a non-oxide ceramic part in the form of an as-machined CVD SiC gas distribution plate in a TCP™ 9100 high density plasma dielectric etch chamber available from LAM Research Corporation, a large number of particles contaminated a silicon wafer during processing. In a standard particle test, it was found that >20,000 particles contaminated the wafer and the average particle size of the particles was in the range of 0.2 to 0.5 µm. Auger analysis of the particles revealed that the contaminating particles were SiC particles. The SiC particles appear to be residual damage from machining of the SiC gas distribution plate.

In order to compare the particle performance of a part prepared according to the invention versus a part having inferior particle performance, machined CVD SiC parts and/or samples were surface conditioned as follows.

Comparative CVD SiC samples and a CVD SiC gas distribution plate (GDP) were prepared by $CO_2$ blasting (a technique used to clean $Al_2O_3$) the CVD SiC material to determine if the 0.2 µm SiC particles could be cleaned from the surface. The comparative samples were analyzed using SEM and the GDP was tested in a plasma etcher. FIGS. 1a-d show SEM images of a machined CVD SiC sample surface after the $CO_2$ cleaning and it can be seen that SiC particles are on the surface of the sample. In a particle test, plasma processing with the $CO_2$ cleaned GDP resulted in a reduction in the number of particles transferred to a silicon wafer processed in the etcher but the number of particles was over 10,000. It is believed that the $CO_2$ cleaning is effective in removing loose SiC particles but other partially attached SiC particles formed during machining of the part are not removed until attacked by the plasma in the etcher and once liberated can contaminate the wafer.

Another technique tested involved a low pressure SiC bead blasting process followed by $CO_2$ cleaning. The results of this cleaning process are shown in the SEM images of FIGS. 2a-d which show SiC particles on the surface of a machined CVD SiC sample which had been subjected to low pressure SiC bead basting followed by $CO_2$ cleaning.

In another technique, high temperature oxidation followed by chemical etching was carried out. In this process, the high temperature oxidation of the SiC depends on the partial pressure of the oxygen used in the heat treatment. That is, at higher oxygen levels, an increase in weight is observed in the passive oxidation by the formation of a $SiO_2$ film according to the following equation: $2SiC_{(s)} + 3O_{2(g)} = 2SiO_{2(s)} + 2CO_{(g)}$. At lower oxygen partial pressures, the active oxidation causes rapid weight loss by formation of SiO gas according to the following equation: $SiC_{(s)}+2SiO_{2(s)}=3SiO_2+2CO_{(g)}$ or $SiC_{(s)}+O_{2(s)}=SiO_{2(g)}+CO_{(g)}$. In general, the passive oxidation rate occurs as a function of time and temperature as defined by the following equation: (oxide thickness)$^2$=(parabolic rate constant)×(time). Accordingly, SiO$_2$ thickness grows at a parabolic rate, meaning the rate decreases as thickness increases. This decrease in the oxidation rate is associated with the diffusion of oxygen through the SiO$_2$ layer that is formed. In addition, it has been determined that the oxidation rate varies as a function of the crystallographic orientation of the CVD SiC. The <111> plane oxidizes at a faster rate that the <111> plane. Because the typical CVD SiC components are randomly oriented in the <111> direction, the parabolic rate constants for this direction were chosen for evaluating the oxidizing heat treatment of the CVD SiC components, as follows:

| Temperature (° C.) | Parabolic Rate Constant (nm$^2$/min) |
|---|---|
| 1200 | 4.06 × 10 |
| 1300 | 3.31 × 10$^2$ |
| 1400 | 9.43 × 10$^2$ |
| 1450 | 2.86 × 10$^3$ |
| 1500 | 4.97 × 10$^3$ |

Figure 3:
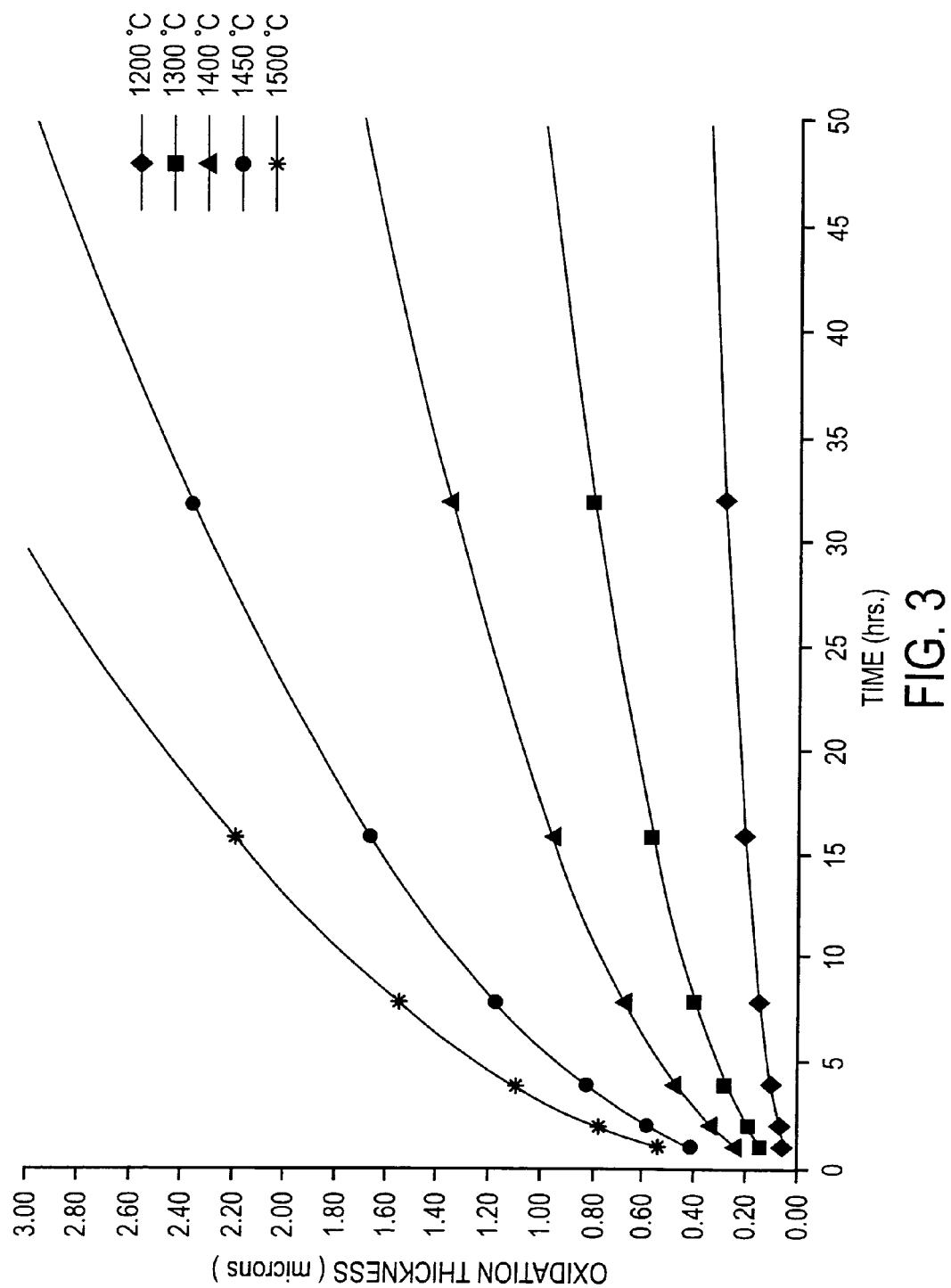
FIG. 3 shows oxidation kinetics for single crystal SiC in the <111> direction.
Figure 4A:
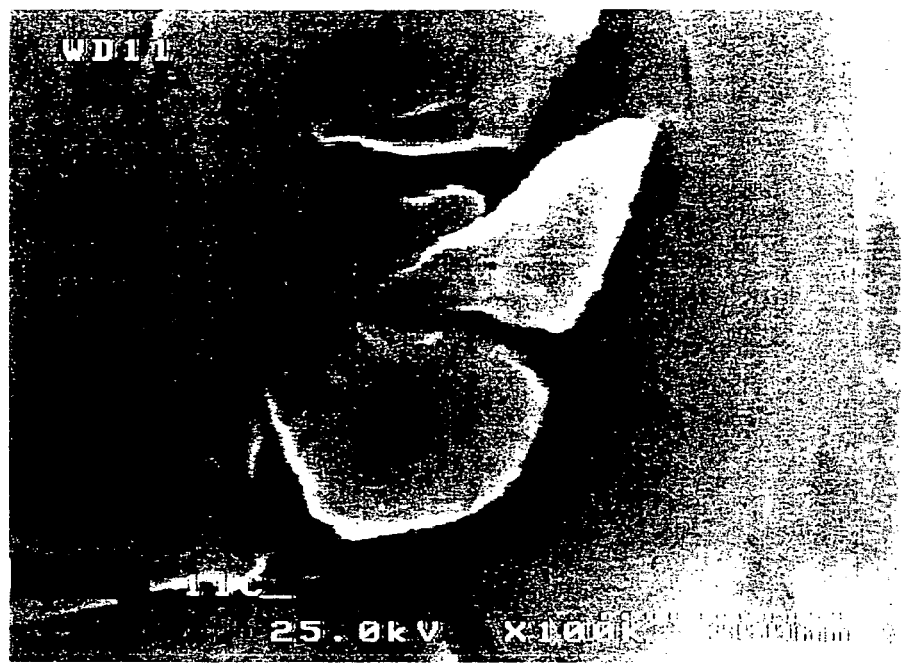
FIGS. 4a-d show SEM images of sample 11C oxidized at 1200° C. for 12 hours.
Figure 4B:
Figure 4C:
Figure 4D:
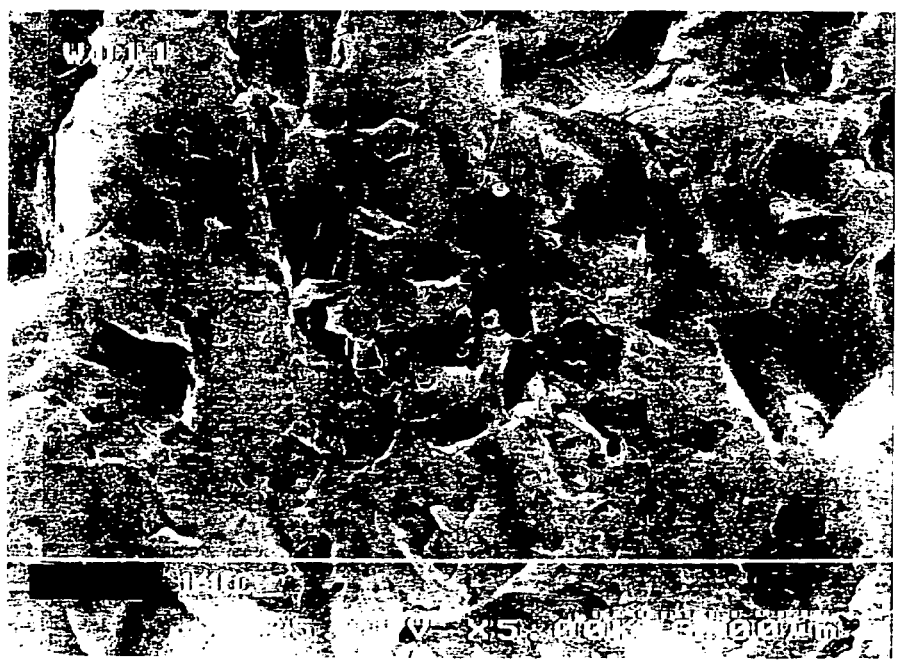
Figure 5A:
FIGS. 5a-d show SEM images of sample 12C oxidized at 1450° C. for 12 hours.
Figure 5B:
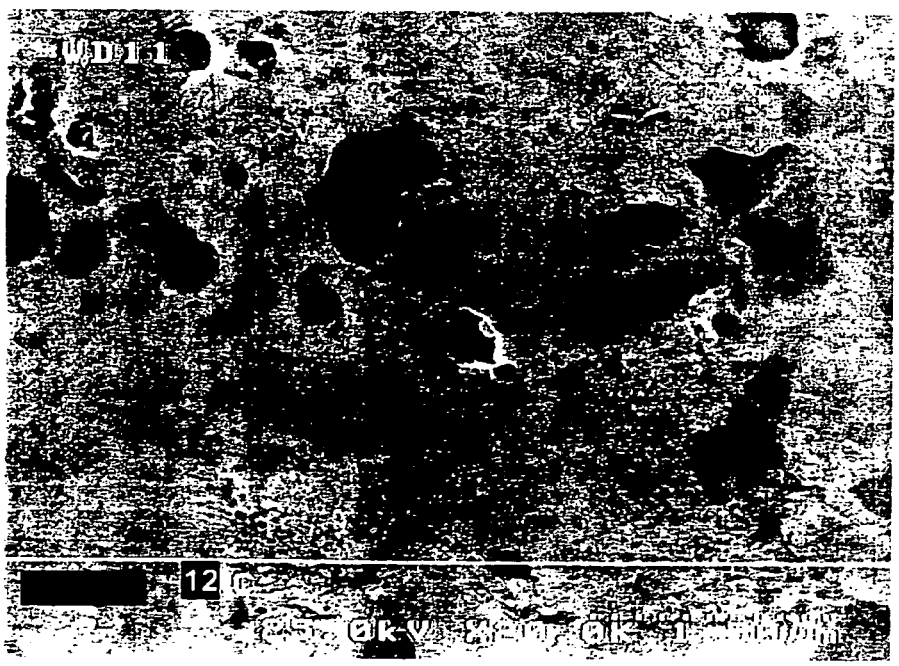
Figure 5C:
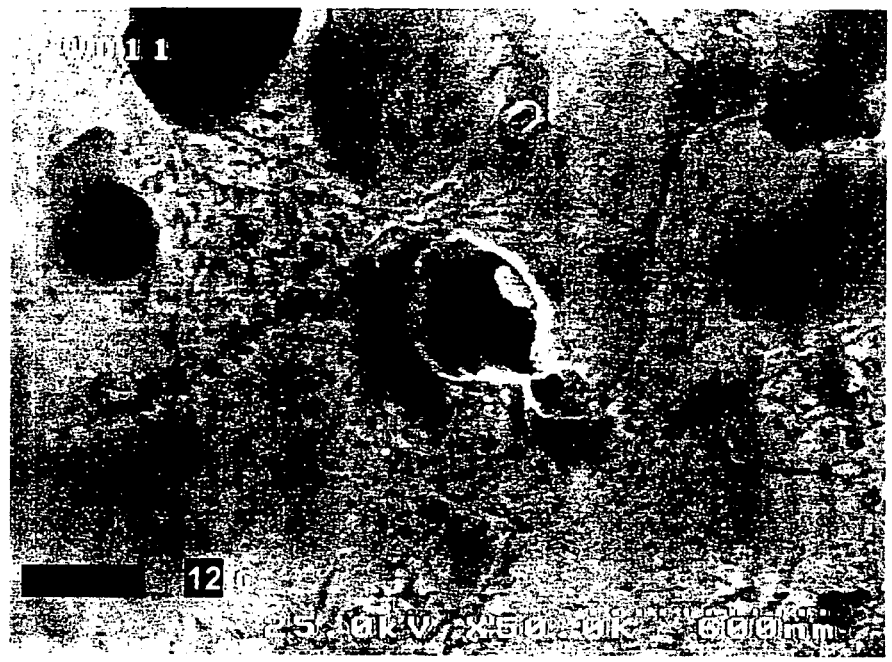
Figure 5D:

FIG. 3 illustrates the theoretical oxidation thickness calculated on the basis of the parabolic rate constants set forth in the above table. In order to incorporate SiC particles having sizes of 0.2 to 0.5 μm in the oxide layer, the oxidation treatment is preferably carried out under oxidizing conditions at a temperature and time sufficient to form an oxide layer at least as thick as the SiC particles. If desired, water vapor or other oxygen source can be used to adjust the oxygen partial pressure of a furnace atmosphere wherein the parts are oxidized. For instance, the oxidation treatment can be carried out in air at 1200 to 1700° C. to provide an oxide layer having a thickness of at least 0.2 μm.

FIGS. 4a-d show SEM images from Sample 11C which is a coupon measuring 0.75"×0.75"×0.125" and treated by oxidizing in air at 1200° C. for 12 hours to achieve a target oxide thickness (e.g., estimated to be about 0.15 μm) followed by chemically stripping the oxide with an etchant of hydrofluoric acid and deionized water (DI), e.g., 1HF:1HNO$_3$:1DI for 12 hours.

FIGS. 5a-d show SEM images from Sample 12C which is a coupon measuring 0.75"×0.75"×0.125" and treated by oxidizing in air at 1450° C. for 12 hours to achieve a target oxide thickness (e.g., estimated to be about 1.4 μm) followed by chemically stripping the oxide with 1HF:1HNO$_3$:1DI for 12 hours. Compared to as-machined surfaces, the treated surfaces had a substantially reduced number of particles and samples treated at higher temperatures exhibit smoother surfaces compared to samples treated at lower temperatures.

Standard particles per wafer per pass (PWP) tests were carried out using a LAM 9100™ plasma etch reactor with (1) a machined CVD SiC GDP subjected to standard wet cleaning and (2) the same GDP after an oxidation and oxide stripping conditioning treatment.

During a first PWP test, a polished silicon wafer used to measure particles (particle wafer) was loaded in the chamber, a standard process recipe was run (i.e., a main etch recipe using a chamber pressure of 5 mTorr, TCP™ power of 1700 W, bottom electrode off, 8 sccm $C_4F_8$+20 sccm $C_2F_6$+100 sccm Ar for 60 seconds followed by a multi-step in-situ chamber clean using chamber pressures of 15 to 80 mTorr, TCP™ power of 1500 to 1750 W, bottom electrode off, and 300 to 750 sccm $O_2$ in 15 second intervals), the wafer was removed from the chamber and put back on the particle counter (e.g., KLA Tencor Surfscan 6200) which generated a particle map. The particle map showed that the wet cleaned GDP displayed very poor particle performance since the particles saturated the particle counter.

This GDP was removed from the chamber and subjected to an oxidizing treatment (1450° C. for 12 hours in air) to provide a layer of oxide of at least 0.5 μm after which the oxide was wet chemically stripped with a solution of 1HF:1HNO$_3$:1DI. Critical dimensions and weight loss of the gas distribution plate were measured before and after the conditioning process. As a result of these measurements it was determined that the gas distribution plate remained dimensionally stable during the high temperature oxidation treatment and the weight loss (which was about 0.7%) as a result of the oxide stripping indicates that the attached particles were efficiently removed from the surface.

The conditioned GDP was reinstalled in the same chamber and another PWP test was run. The test revealed that the particle count was reduced by orders of magnitude, i.e., the particle map showed a particle count of 123. However, taking into account certain extraneous sources of particles such as the number of particles on the particle wafer prior to the test (measured at 22 particles), the particles contributed by the load lock cassette (measured at 25 particles) and the particles contributed by the wafer transport mechanism (not measured), the adjusted particle count attributed primarily to the GDP was 76.

In running production wafers, it is desirable to reduce the particle count to below 20, preferably below 10 particles. To improve the particle performance of the GDP, the GDP can be exposed to a plasma environment in the reactor by running an aggressive plasma condition in the reactor. For example, the process recipe conditions can be made more aggressive to the GDP by increasing the plasma density (e.g., increasing the TCP coil power 1700 to 2300 W), increasing chamber pressure (e.g. 200 to 500 mTorr) and changing the gas chemistry to be more reactive towards the part being conditioned (e.g., increasing fluorocarbon flow rate, adding oxygen, and/or adding Ar for sputtering SiC parts).

In an actual production environment, wherein wafers were processed in a plasma etch reactor (i.e., a LAM TCP™ 9100) using the oxidized and chemically cleaned CVD SiC gas distribution plate, it was found that particle contamination could be reduced from the saturated particle count for an as-machined gas distribution plate to less than 100 adders with the conditioned gas distribution plate immediately after installation of the plate. The particle contamination was further reduced to less than 10 adders by subjecting the plate to an aggressive plasma treatment in the etch reactor for 1 hour with 25 conditioning wafers. In particular, the etch reactor was run using elevated pressure, elevated TCP™ power and elevated flow of the fluorine containing gas (e.g., chamber pressure of 200 to 500 mTorr, TCP™ power of 2000 to 2500 W, $C_2F_6$ flow of 40 to 60 sccm, and changing of coil termination capacitance to move the area of high intensity plasma across the GDP).

Although the examples given above are for non-oxide ceramic parts made of silicon carbide, the surface treatment according to the invention can be used on other ceramic parts such as alumina, silicon dioxide, quartz, carbon, silicon, nitride materials such as silicon nitride, boron nitride, aluminum nitride, etc. or carbide materials such as boron carbide, titanium carbide and the like.

Ceramic parts of silicon carbide can be prepared by many different techniques including chemical vapor deposition (CVD), sintering SiC powder (e.g., slip cast or hot pressed SiC powder), sintering SiC powder and infiltrating with Si, sintering SiC powder and coating with CVD SiC, conversion of graphite with silicon vapor to form SiC, conversion of graphite to form SiC and infiltrating with Si, conversion of graphite to form SiC and coating with CVD SiC, etc. Parts of such materials can be conditioned according to the invention to provide improved particle performance. For instance, machined or sintered surfaces of such parts can be used directly after an oxidizing treatment to incorporate particles in an oxide layer in which case the oxide layer is not stripped from the part prior to installation of the part in a semiconductor processing apparatus such as a vacuum chamber. Alternatively, the oxide layer can be stripped prior to use of the part in a semiconductor processing apparatus.

CVD SiC can be used to surround a wafer in a rapid thermal processing (RTP) chamber. Such material is translucent when machined very thin making it difficult to obtain temperature measurements using an infrared (IR) pyrometer. To solve this problem the SiC can be coated with a thin layer of high purity silicon but such a technique is problematic in that the part rejection rate is high due to growth of dendritic silicon presumably from surface particulate. By treating the machined SiC with the oxidizing and oxide stripping treatment according to the invention, it is possible to reduce the surface particulate and thereby raise the yield of the silicon coated SiC product.

Ceramic parts such as silicon carbide and silicon nitride transfer members can be used in high temperature wafer support applications for loading, processing and unloading the wafers. During such support applications, in order to minimize wafer backside scratching, the ceramic parts can be treated according to the invention to provide a smoother wafer contacting surface. For instance, the parts can be given an oxidizing treatment in accordance with the invention to provide a smooth oxide surface layer. Further, the oxidized layer can be stripped in accordance with the invention if a non-oxide surface is desired.

The ceramic part treated according to the invention can have any desired configuration such as that of a wafer passage insert, a chamber wall or liner, a substrate support, an electrode, a showerhead, a gas distribution plate or component such as a baffle plate, a transfer member, focus ring, edge ring, plasma screen, window, etc. Preferred materials for the ceramic part are Si and SiC in the case of plasma environments since such materials meet the high purity requirements of semiconductor processing equipment and plasma erosion of Si or SiC conditioned surfaces produces gaseous Si or C compounds which can be pumped from the chamber without particle contamination of the substrate. SiC also has the advantage of exhibiting exceptionally high thermal conductivity enabling parts of such material to be heated or cooled to a desired temperature range during processing of substrates such as silicon wafers.

Figure 6:
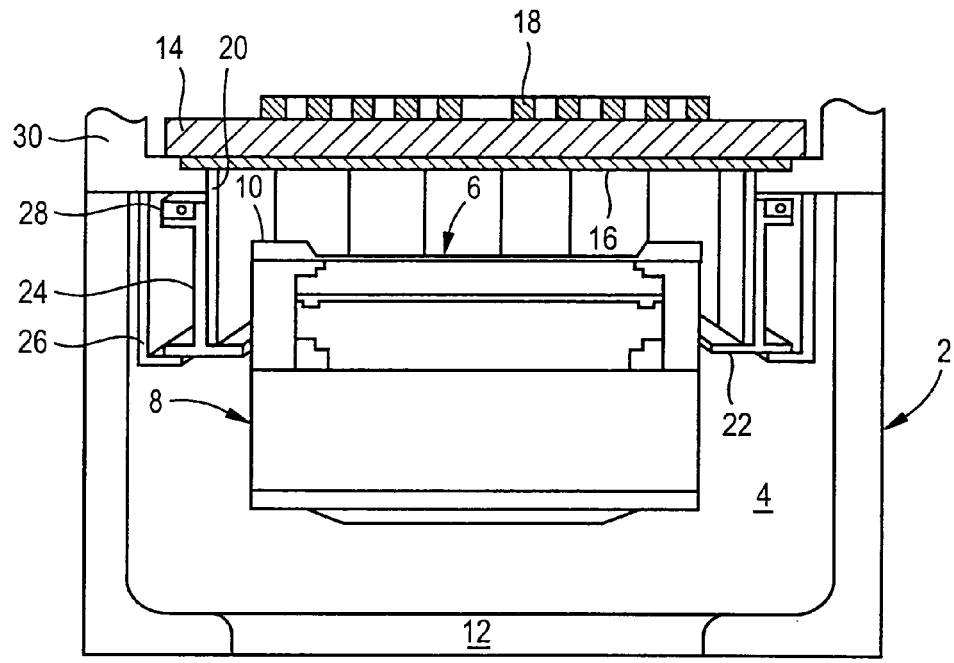
FIG. 6 shows a single wafer vacuum processing chamber having an inductively coupled plasma source and a SiC gas distribution plate in accordance with the invention.

The ceramic part can be used in any plasma reaction chamber wherein it is desired to reduce particle contamination. An example of a single wafer vacuum processing chamber 2 having an inductively coupled plasma source is shown in FIG. 6 wherein processing gas is supplied to the processing chamber 2 by suitable apparatus (not shown) such as gas distribution rings, gas distribution plate, injection nozzles, etc., and a vacuum is maintained in the interior 4 of the chamber by suitable vacuum pump apparatus. The substrate to be processed in the chamber can comprise a silicon semiconductor wafer 6 supported on a substrate support 8. The substrate support 8 can include an electrostatic chuck and a focus ring 10. The vacuum pump can be connected to a large outlet port 12 in an endwall such as the bottom of process chamber. The vacuum processing chamber can include a dielectric window 14, a gas distribution plate 16 and RF power can be supplied to the chamber through an external RF antenna such as a planar coil 18 outside the dielectric window 14 on an endwall such as the top of the chamber. However, the plasma generating source can be of any other type of plasma generating equipment such as that of an ECR reactor, a capacitively coupled parallel plate reactor, a surface wave reactor, a magnetron reactor, helicon reactor, helical resonator, etc. The plasma generating source can be attached to a modular mounting arrangement such as an annular mounting flange which is removably mounted on the endwall of the chamber.

The chamber includes a liner 20, a plasma screen 22 for confining the plasma in the space surrounding the wafer 6 extends inwardly from the lower end of the liner 20 and a wafer passage insert. The liner 20 can be supported in any suitable way such as by an elastically bendable frame in the case of a solid cylindrical liner which includes an inner support frame 24 and an outer support frame 26. In order to maintain the liner at a desired temperature during processing of a substrate, a heater 28 can be provided on the top of the inner frame support 24. In operation, the heater 28 is effective to heat the liner 20 and removal of heat from the liner 20 can be accomplished by a temperature controlled member 30 which withdraws heat from the liner through the inner and outer frames. Other types of heating arrangements such as a heater embedded in the liner or suitable radiant heating arrangements can also be used.

The plasma chamber liner 20 can comprise a one-piece liner or multi-piece liner such as interlocking ceramic tiles. To provide an electrical ground path for the plasma, the tiles are preferably of an electrically conductive material such as silicon and carbon. For example, the tiles can be entirely of CVD SiC or Si impregnated SiC coated with CVD SiC. Such a material provides an added benefit in that it does not contain aluminum and thus reduces Al contamination of processed substrates. The SiC tiles can be bonded to an aluminum backing plate using an electrically conductive elastomer which can absorb lateral stresses caused by different thermal expansion coefficients of the SiC and Al. Each tile and backing plate assembly can be attached directly or indirectly to the chamber wall. For example, the tiles can be supported by a support frame which includes an inner frame and an outer frame. Temperature control of the liner can be achieved by a heater supplied power by electrical leads and a temperature controlled member.

The plasma screen 22 can extend inwardly from a lower edge of the tiles and the plasma screen can be of an electrically conductive ceramic material such as Si impregnated SiC coated with CVD SiC and includes openings which are small enough to confine the plasma but allow process gas and processing byproducts to be removed by the vacuum pump.

Figure 7:
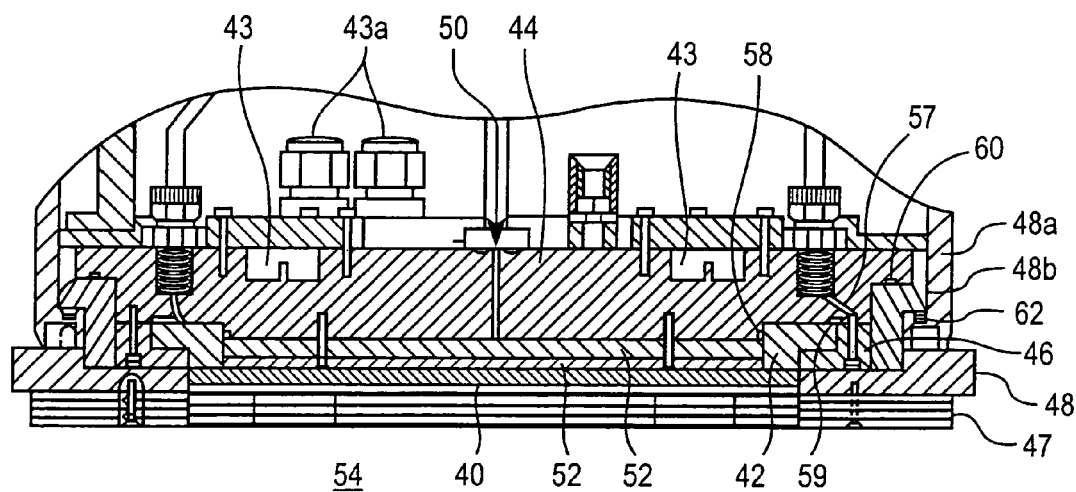
FIG. 7 shows a single wafer vacuum processing chamber having a showerhead electrode and SiC baffle plate in accordance with the invention.

Like the GDP described above, the showerhead electrode assembly shown in FIG. 7 is a consumable part which must be replaced periodically. Because the electrode assembly is attached to a temperature-controlled member, for ease of replacement, the upper surface of the outer edge of electrode 40 (e.g., high purity silicon) can be bonded to a support ring 42 (e.g., graphite) with solder or by other techniques, such as by an elastomeric joint.

The electrode 40 shown in FIG. 7 is a planar disk having uniform thickness from center to edge thereof and an outer flange on ring 42 is clamped by a clamping ring 46 to a temperature-controlled member 44 having water cooling channels 43. Water is circulated in the cooling channels 43 by water inlet/outlet connections 43a. A plasma confinement ring 47 surrounds the outer periphery of electrode 40. The plasma confinement ring 47 is bolted to a dielectric annular ring 48 which in turn is bolted to a dielectric housing 48a. The purpose and function of confinement ring 47 is to cause a pressure differential in the reactor and increase the electrical resistance between the reaction chamber walls and the plasma thereby confining the plasma between the upper and lower electrodes. A radially inwardly extending flange of clamping ring 46 engages the outer flange of support ring 42. Thus, no clamping pressure is applied directly against the exposed surface of electrode 40.

Process gas from a gas supply is supplied to electrode 40 through a central hole 50 in the temperature-controlled member 44. The gas then is distributed through one or more vertically spaced apart baffle plates 42 and passes through gas distribution holes (not shown) in the electrode 40 to evenly disperse the process gas into reaction chamber 44. In order to provide enhanced heat conduction from electrode 40 to temperature-controlled member 44, process gas can be supplied to fill open spaces between opposed surfaces of temperature-controlled member 44 and support ring 42. In addition, gas passage 57 connected to a gas passage (not shown) in the annular ring 48 or confinement ring 47 allows pressure to be monitored in the reaction chamber 54. To maintain process gas under pressure between temperature-controlled member 44 and support ring 42, a first O-ring seal 58 is provided between an inner surface of support ring 42 and an opposed surface of temperature-controlled member 44 and a second O-ring seal 59 is provided between an outer part of an upper surface of support ring 42 and an opposed surface of member 44. In order to maintain the vacuum environment in chamber 24, additional O-rings 60, 62 are provided between temperature-controlled member 44 and cylindrical member 48b and between cylindrical member 48b and housing 48a. In accordance with the invention, the lower baffle 42a is made of a non-oxide ceramic such as carbon silicon, silicon carbide, silicon nitride, boron carbide, boron nitride, titanium carbide or aluminum nitride.

According to a preferred embodiment of the invention, the lower baffle plate can be made of a highly pure silicon carbide, e.g., at least about 99.999% pure. An especially preferred silicon carbide from a cost perspective is a non-sintered form of silicon carbide made by graphite conversion wherein a shaped piece of graphite is reacted with silicon vapor at temperatures such as 1600° C. to convert the graphite to silicon carbide. The starting graphite is preferably a fine particle, low porosity high purity graphite shaped to desired dimensions. As a result of the conversion to silicon carbide by the silicon vapor, the bulk silicon carbide can have a porosity ranging from 10 to 30%, e.g., around 20%. If desired, part can be back-filled with silicon and/or the part can be coated with a layer of CVD SiC.

The non-oxide ceramic baffle plate can be designed as a drop-in replacement for existing aluminum baffle plates or as a part of any gas distribution system wherein it is desired to reduce contamination attributable to that particular part. Because the baffle plate will undergo some machining, it is desirable to condition the baffle plate in accordance with the invention, e.g., oxidizing the surface and removing the oxide layer by chemical etching. The baffle plate can be used as a drop-in replacement for the aluminum baffle plate of an Exelan® or 4520XLE®, both of which are manufactured by LAM Research Corporation.

Like the GDP discussed above, the ceramic baffle plate according to the invention provides reduced particle contamination. That is, since the lower baffle is directly behind the showerhead electrode, a line-of-sight exists between it and the plasma via the holes in the showerhead electrode. Ions generated in the plasma are accelerated through the showerhead holes towards the baffle, causing the baffle surface to be sputtered. As a result, particles from a machined surface of the baffle plate could enter the chamber and contaminate the wafer undergoing processing. Such particle defects reduce the yield of the wafer.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A ceramic part for a vacuum processing chamber for processing semiconductor substrates, the ceramic part comprising:
   a non-oxide ceramic material having an as-machined or as-sintered outer surface; and
   a silicon oxide layer on the outer surface of the non-oxide ceramic material and forming an outermost surface of the ceramic part, the silicon oxide layer having incorporated therein particles of the non-oxide ceramic material which are attached on the outer surface.

2. The ceramic part of claim 1, which is a gas distribution plate.

3. The ceramic part of claim 1, which is an electrode.

4. The ceramic part of claim 1, which is a baffle plate of a showerhead electrode assembly.

5. The ceramic part of claim 1, which is a chamber liner.

6. The ceramic part of claim 1, which is a plasma screen.

7. The ceramic part of claim 1, which is a focus ring or an edge ring.

8. The ceramic part of claim 1, which is a window.

9. The ceramic part of claim 1, wherein the silicon oxide layer has a thickness which is greater than the thickness of the particles.

10. A ceramic part for a vacuum processing chamber for processing semiconductor substrates, the ceramic part comprising:
    silicon or silicon carbide having an as-machined or as-sintered outer surface; and
    a silicon oxide layer on the outer surface of the silicon or silicon carbide and forming an outermost surface of the ceramic part, the silicon oxide layer having incorporated therein particles of the silicon or silicon carbide which are attached on the outer surface.

11. The ceramic part of claim 10, wherein the non-oxide ceramic material is CVD SiC, sintered SiC, sintered SiC coated with CVD SiC, SiC formed by converting graphite using silicon vapor, or porous silicon carbide backfilled with silicon.

12. The ceramic part of claim 10, which is a gas distribution plate.

13. The ceramic part of claim 10, which is an electrode.

14. The ceramic part of claim 10, which is a baffle plate of a showerhead electrode assembly.

15. The ceramic part of claim 10, which is a chamber liner.

16. The ceramic part of claim 10, which is a plasma screen.

17. The ceramic part of claim 10, which is a focus ring or an edge ring.

18. The ceramic part of claim 10, which is a window.

19. The ceramic part of claim 10, wherein the silicon oxide layer has a thickness which is greater than the thickness of the particles.

20. A showerhead electrode for a vacuum processing chamber for processing semiconductor substrates, the showerhead electrode comprising:
   silicon or silicon carbide having an as-machined or as-sintered outer surface; and
   a silicon oxide layer on the outer surface of the silicon or silicon carbide and forming an outermost surface of the showerhead electrode, the silicon oxide layer having incorporated therein particles of the silicon or silicon carbide which are attached on the outer surface.

21. The showerhead electrode of claim 20, which is of SiC formed by converting graphite using silicon vapor.

22. The showerhead electrode of claim 20, which is of silicon.

23. The showerhead electrode of claim 20, wherein the silicon oxide layer has a thickness which is greater than the thickness of the particles.

24. The ceramic part of claim 1, wherein the silicon oxide layer is formed by subjecting the non-oxide ceramic material to a heat treatment in air to form the silicon oxide layer on the non-oxide ceramic material.

* * * * *